United States Patent
Musunuri

(10) Patent No.: US 11,268,993 B2
(45) Date of Patent: Mar. 8, 2022

(54) SYSTEMS AND METHODS TO FACILITATE RESOLUTION AND BANDWIDTH OF SUPPLY VOLTAGE

(71) Applicant: Infineon Technologies AG, Neubiberg (DE)

(72) Inventor: Surya Kiran Musunuri, Bangaluru (IN)

(73) Assignee: Infineon Technologies AG, Neubiberg (DE)

( * ) Notice: Subject to any disclaimer, the term of this patent is extended or adjusted under 35 U.S.C. 154(b) by 334 days.

(21) Appl. No.: 16/375,109

(22) Filed: Apr. 4, 2019

(65) Prior Publication Data

US 2020/0319234 A1  Oct. 8, 2020

(51) Int. Cl.
| | |
|---|---|
| G01R 19/252 | (2006.01) |
| G01R 19/25 | (2006.01) |
| H03L 7/099 | (2006.01) |
| H03M 1/12 | (2006.01) |

(52) U.S. Cl.
CPC ....... *G01R 19/252* (2013.01); *G01R 19/2506* (2013.01); *H03L 7/099* (2013.01); *H03M 1/1245* (2013.01)

(58) Field of Classification Search
CPC .................................................. G01R 19/252
See application file for complete search history.

(56) References Cited

U.S. PATENT DOCUMENTS

| | | | |
|---|---|---|---|
| 6,686,804 B1 * | 2/2004 | Adams | H03L 7/185 331/17 |
| 9,804,207 B1 * | 10/2017 | Lesea | G01R 19/2509 |
| 2020/0244279 A1 * | 7/2020 | Balboni | H03M 1/1245 |

* cited by examiner

*Primary Examiner* — Daniel C Puentes
(74) *Attorney, Agent, or Firm* — Eschweiler & Potashnik, LLC

(57) ABSTRACT

A arrangement is disclosed for an on-chip system having an increased resolution for supply voltage measurements. The system includes a phase locked loop (PLL), a divider, and a timer. The PLL is configured to generate an oscillator signal. The divider is configured to divide the oscillator signal to generate an divided clock signal. The timer is configured to generate an application start signal and an analog to digital converter (ADC) start signal based on the oscillator signal and a timer delay (Tdelay). The timer delay (Tdelay) is based on the application start signal and the ADC start signal.

13 Claims, 6 Drawing Sheets

SYSTEMS AND METHODS TO FACILITATE RESOLUTION AND BANDWIDTH OF SUPPLY VOLTAGE

BACKGROUND

Devices, circuits and the like utilize supply voltages to power their circuitry and operate. Power supplies generate the utilized supply voltages.

The supply voltages have characteristics, such as noise, power supply noise, reliability and the like. These characteristics can impact the operation of the devices and circuits utilizing the supply voltages.

Additionally, the supply voltages can be generated on-chip with other circuitry that uses the generated supply voltages. As a result, measurement of the supply voltages can be challenging.

Techniques are needed that facilitate power supply generation and measurement of supply voltages in on-chip environments.

DETAILED DESCRIPTION

Figure 1:
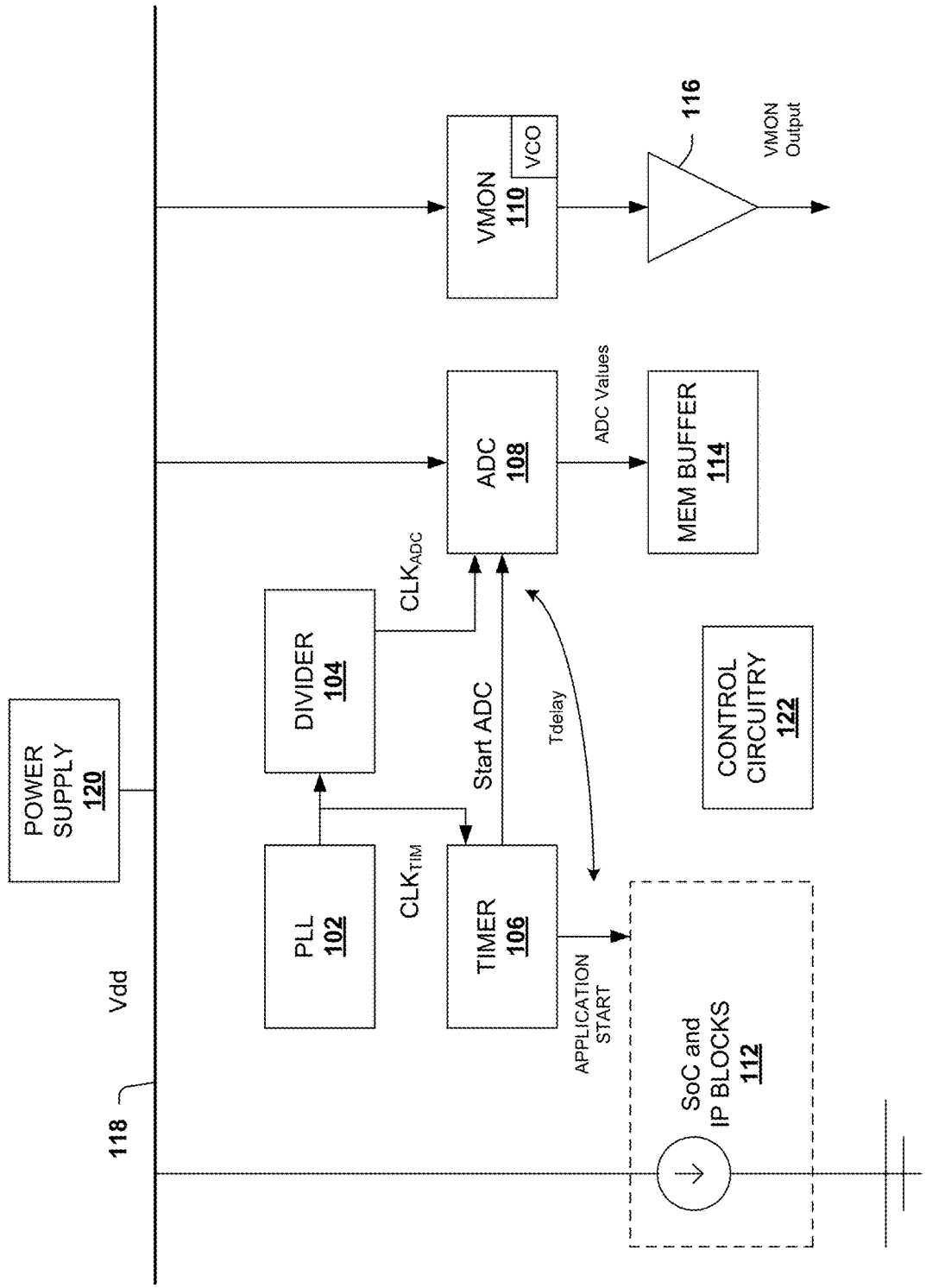
FIG. 1 is a block diagram illustrating an on-chip system having increased resolution and increased bandwidth of supply voltage and signal noise measurements in accordance with one or more embodiments.

The present invention will now be described with reference to the attached drawing figures, wherein reference numerals are used to refer to like elements throughout, and wherein the illustrated structures and devices are not necessarily drawn to scale.

As utilized herein, terms "component," "system," "interface," and the like are intended to refer to a computer-related entity, hardware, software (e.g., in execution), and/or firmware. For example, a component can be a processor (e.g., a microprocessor, a controller, or other processing device), a process running on a processor, a controller, an object, an executable, a program, a storage device, a computer, a tablet PC, an electronic circuit and/or a mobile phone with a processing device. Some other examples of a component include a voltage regulator that provides power for various loads, including loads in automotives, a processor or circuitry in automotive electronics, a processor or circuitry located on a credit card, a switch that drives a valve in an anti-lock braking system (ABS), a switch that drives an electric motor, a pressure sensor, a pressure sensor for an airbag system, a current sensor, a current sensor in an electrical power steering (EPS) system and the like. By way of illustration, an application running on a server and the server can also be a component. One or more components can reside within a process, and a component can be localized on one computer and/or distributed between two or more computers. A set of elements or a set of other components can be described herein, in which the term "set" can be interpreted as "one or more."

Further, these components can execute from various computer readable storage media having various data structures stored thereon such as with a module, for example. The components can communicate via local and/or remote processes such as in accordance with a signal having one or more data packets (e.g., data from one component interacting with another component in a local system, distributed system, and/or across a network, such as, the Internet, a local area network, a wide area network, or similar network with other systems via the signal).

As another example, a component can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, a component can be an apparatus that provides specific functionality through electronic components without mechanical parts; the electronic components can include one or more processors therein to execute software and/or firmware that confer(s), at least in part, the functionality of the electronic components.

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. In some embodiments, the circuitry may be implemented in, or functions associated with the circuitry may be implemented by, one or more software or firmware modules. In some embodiments, circuitry may include logic, at least partially operable in hardware.

Supply voltages are commonly used as power sources in electronic devices. Additionally, signal lines are commonly used to communicate information between devices.

The supply voltages and signal lines can exist on a single chip, referred to as on-chip, with other circuitry. The operation of this other circuitry can depend on the supply voltages, supply voltage generators, signal lines and the like.

A technique to facilitate operation of the circuitry, signal lines, and supply voltages is to measure the supply voltages and the signal lines. The measurements can be used to quantify and identify noise and the like. Additionally, the measurements can be used to take corrective actions to mitigate the noise and the like.

One or more aspects/embodiments are disclosed that facilitate on-chip measurement of signal lines, signals, power supply voltages and/or power supply noise. It is appreciated that there is typically a trade-off between sampling rate and measurement resolution. This trade-off can limits the accuracy and bandwidth of signal lines and supply voltages. The embodiments also include a technique to combine multiple measurements to increase measurement accuracy and bandwidth.

Other approaches to achieve better measurement accuracy and bandwidth rely on complex and expensive ADCs (Analog-to-Digital Converters) into ASICs. However, it is noted that fabrication process constraints and the large amount of die-area taken by the complex ADCs limit their usage within a chip and/or a product line.

FIG. 1 is a block diagram illustrating an on-chip system 100 having increased resolution and increased bandwidth of supply voltage and signal noise measurements in accordance with one or more embodiments. The system 100 is provided for illustrative purposes and it is appreciated that suitable variations are contemplated.

A relatively high sampling rate of a signal/power supply can be achieved by combining data from a high resolution (10 bit or 12 bit) ADC operating at low sampling rate and data from a low resolution (5 or 6 bit), high sampling rate circuit utilizing a voltage controlled oscillator (VCO), referred to as a voltage monitor (VMON) or voltage frequency monitor. The system 100 utilizes the ADC and the VMON and can obtain the relatively high sampling rate, which is useful for supply noise analysis, signal analysis, and the like.

In this example system 100, an ASIC is present that has a capability to start/trigger a use-case/application related portion of code at a time instant defined by a Timer module (IP block within the chip). The ASIC uses the capability of such a chip to start/trigger the ADC at different time delays with respect to the application code thereby increasing an effective sampling rate. Furthermore, this system 100 facilitates calibration of VMON frequency data against ADC data, and can use a calibrated look-up-table to superimpose and/or combine VMON measurements on top of or with ADC generated samples.

The system 100 includes a system on chip (SoC) 112, a phase locked loop (PLL) 102, a divider 104, a timer 106, an analog to digital converter (ADC) 108, a voltage monitor (VMON 110), an output amplifier 116, a memory buffer 114, and one or more power supply generators/sources 120.

The SoC 112 can be or include an application specific integrated circuit (ASIC) and operates using the supply voltage 118. The SoC 112 is initialized or started in response to an Application Start signal. The SoC 112 can include a variety of suitable circuitry including IP blocks.

The power supply 120 provides or generate a power supply voltage 118 (Vdd). The supply 118 is provided or coupled as an input to the ADC 108, the SoC 112, and the VMON 110.

The VMON 110 is typically free running and its output (VMON output) is a frequency, which can be considered a clock signal. The frequency of the VMON output is related to a voltage or voltage level at an input of the VMON 110. Here, the voltage level at the input is the supply voltage 118.

The PLL 102 generates an oscillator signal ($CLK_{TIM}$) at its output, such as a local oscillator (LO) signal. The divider receives the oscillator signal at its input and divides the oscillator signal by a selected divide value to generate a divided clock for the ADC 108, referenced as $CLK_{ADC}$. Thus, the oscillator signal operates a frequency of the selected divide value times the divided clock $CLK_{ADC}$. It is appreciated that other suitable techniques for generation of the clock signals are contemplated.

The timer 106 receives the oscillator signal and is configured to generate an ADC trigger (Start ADC) or signal having a specific time delay (Tdelay) with respect to an application start of the SoC 112. The Start ADC is based on an ADC start counter value and/or Tdelay. Thus, the ADC 108 starts a time period or delayed, specified as Tdelay, after the SoC 112 has started.

The Timer 106 and the ADC 108 operate on same root clock, i.e. the PLL (phase locked loop) output ($CLK_{TIM}$) is used directly for the Timer 106 whereas the PLL output is divided down and given as sampling clock $CLK_{ADC}$ for the ADC 108. Once application code is started in the SoC 112, one or more sub-systems and IPs within the SoC 112 are activated, thereby leading to current consumption changes and supply voltage (Vdd) noise.

The timer 106 can be configured with an application start counter value and the ADC start counter value. These counter values can be selected and/or adjusted to control when application code of the SoC 112 is started and when operation of the ADC 108 is started. The difference between the application start counter value and the ADC start counter value is the Tdelay or ADC start delay, described above.

In operation, the ADC 108 can be swept from 1 to a selected value for various Tdelay values to generate a plurality of sweep values for a single point or sample point. The plurality of sweep values can be combined, averaged, and the like to generate.

Control circuitry 122 can be configured to perform the sweep of Tdelay values for the ADC 108, set and/or adjust Tdelay values for the timer 106, adjust the selected divide for the divider 104, convert the VMON output (a frequency based on the supply voltage 118) to a voltage, calibrate the VMON 110, generate a lookup table of voltage values indexed by frequency for the VMON 110, perform analysis of sampled values and the like.

It is appreciated that suitable variations of the system 100 are contemplated.

Figure 2:
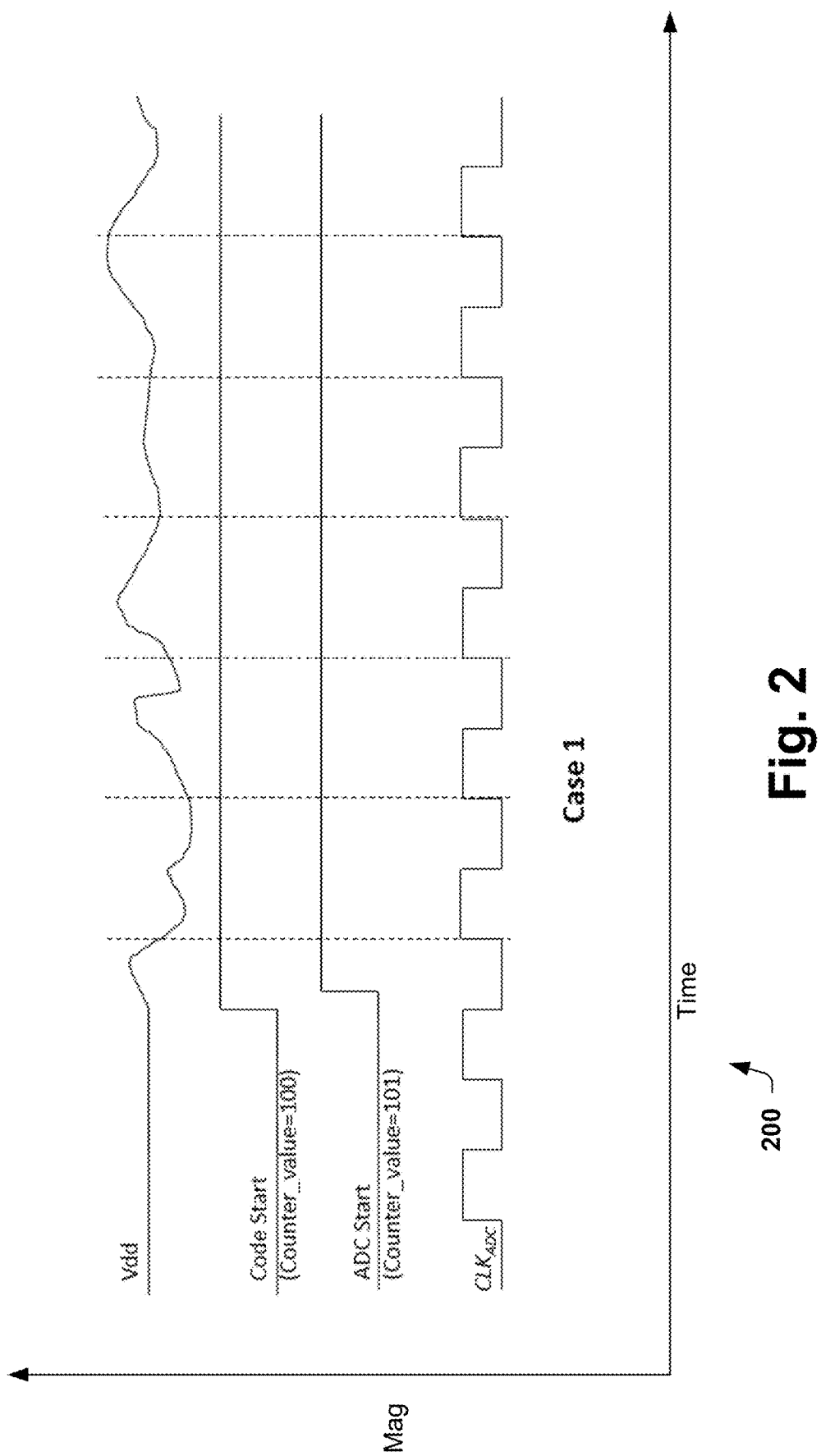
FIG. 2 is a graph illustrating example signal values for an on-chip system in accordance with one or more embodiments.

FIG. 2 is a graph illustrating example signal values 200 for an on-chip system in accordance with one or more embodiments. The signal values 200 are provided as examples for illustrative purposes and it is appreciated that other values, frequencies and the like are contemplated. The signal values 200 are for a "Case 1".

The signal values 200 includes a supply voltage (Vdd) an application start (Code Start) counter value, an ADC Start counter value, and a divided clock ($CLK_{ADC}$).

An x-axis depicts increasing time and a y-axis depicts increasing magnitude.

The supply voltage is generated by a voltage source, such as the source 120.

The code start is the application start counter value for the application code of the SoC 112.

The ADC start is the ADC start counter value for the ADC 108.

The divided clock ($CLK_{ADC}$) is the clock signal used by the ADC 108. In this example, the divided clock is 1/100 of the oscillator signal ($CLK_{TIM}$).

In this example, the code start has a value of 100 and the ADC start has a value of 101. As a result, the SoC 112 starts or its application code starts after 100 $CLK_{TIM}$ cycles and the ADC starts after 101 $CLK_{TIM}$ cycles. Thus, Tdelay, in this example, is 1 or 1 $CLK_{TIM}$ cycle.

Figure 3:
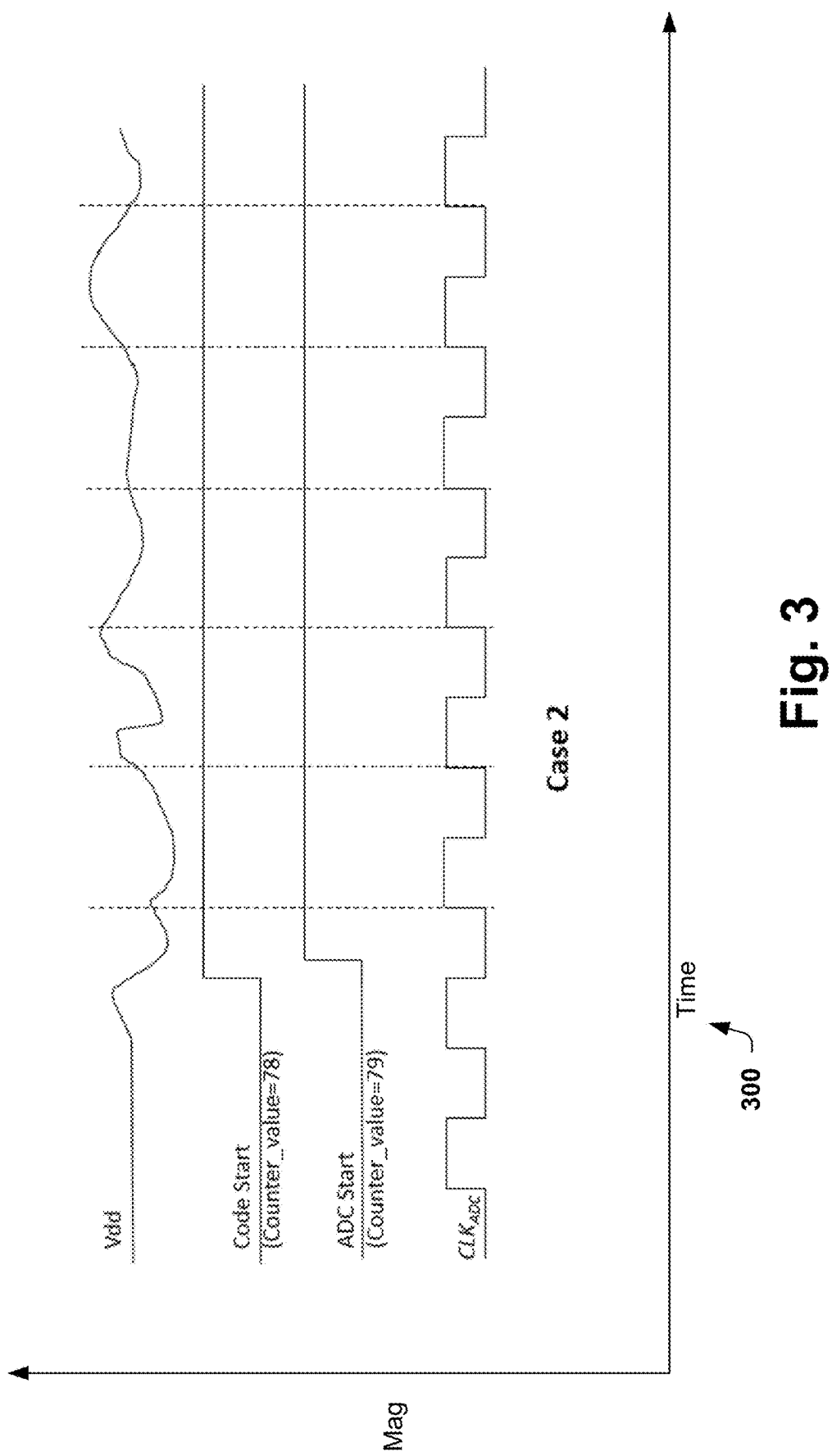
FIG. 3 is a graph illustrating example signal values for an on-chip system in accordance with one or more embodiments.

FIG. 3 is a graph illustrating example signal values 300 for an on-chip system in accordance with one or more embodiments. The signal values 300 are provided as examples for illustrative purposes and it is appreciated that other values, frequencies and the like are contemplated. The signal values 300 are for a "Case 2".

The signal values 300 includes a supply voltage (Vdd) an application start (Code Start) counter value, an ADC Start counter value, and a divided clock ($CLK_{ADC}$).

An x-axis depicts increasing time and a y-axis depicts increasing magnitude.

The supply voltage is generated by a voltage source, such as the source 120.

The code start is the application start counter value for the application code of the SoC 112.

The ADC start is the ADC start counter value for the ADC 108.

The divided clock ($CLK_{ADC}$) is the clock signal used by the ADC 108. In this example, the divided clock is 1/100 of the oscillator signal ($CLK_{TIM}$).

In this example, the code start has a value of 78 and the ADC start has a value of 79. As a result, the SoC 112 starts or its application code starts after 78 $CLK_{TIM}$ cycles and the ADC starts after 79 $CLK_{TIM}$ cycles. Thus, Tdelay, in this example, is 1 or 1 $CLK_{TIM}$ cycle.

Once the application code activates IPs/modules within the SoC 112, the ADC start is triggered. Changes or noise in the Vdd are generated because the application code has been started. This noise is sampled by the ADC 108. Assuming that the application code, silicon part, environment conditions, and setup are the same between both the cases, the generated Vdd noise would also be the same (with respect to the application start point in the time axis). As a result, the ADC 108 samples the Vdd noise at different points for both cases (200 and 300). The Tdelay (indirectly the difference in number of timer clock cycles) between the application start and ADC start can also be changed, for example, by testcode. For example, instead of using 1 timer cycle delay as shown in Case 1 and Case 2, this count value difference can be swept from 1 to another value.

If there are N $CLK_{TIM}$ cycles for every $CLK_{ADC}$ cycle, then the ADC values read for count value difference Tdelay would correspond to those values read using delay of Tdelay MOD N Sweeping through various Tdelay values generates multiple ADC read/measured values by the ADC 108 for the same point in Vdd noise. Thus, these duplicate values can be averaged or otherwise combined for final output (after eliminating outliers). As shown above, this technique of sweeping through the possible Tdelay values can effectively increase the sampling rate of the Vdd noise by N times.

Figure 4:
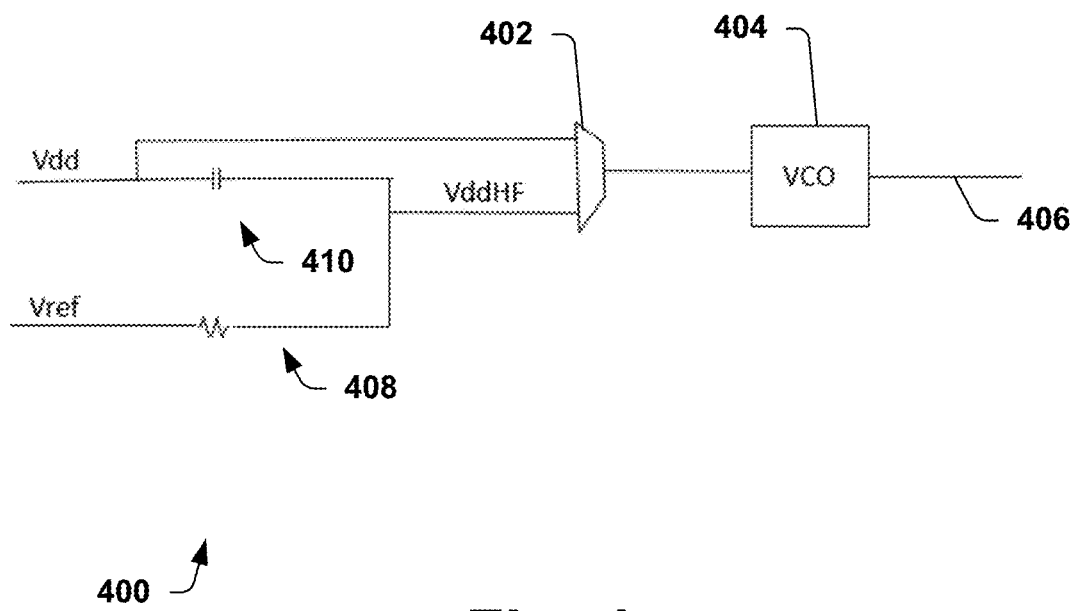
FIG. 4 is a diagram illustrating a voltage monitor (VMON) in accordance with one or more embodiments.

FIG. 4 is a diagram illustrating a voltage monitor (VMON) 400 in accordance with one or more embodiments. The VMON 400 is provided for illustrative purposes and it is appreciated that suitable variations are contemplated.

The VMON 400, also referred to as a voltage frequency monitor, can be used as the VMON 110 in the system 100, described above.

A high frequency voltage controlled oscillator (VCO) 404 can be used as the voltage monitor (VMON) 110. Sweeping through various time delays with the ADC 108 results in a ($f_{ADC}*N$) effective sampling rate. It is appreciated that measuring or capturing high frequency noise components of the supply voltage is of interest.

In order to focus on the high frequency noise components, the VMON 400 can include a multiplexer 402 and circuitry 408 that provide a high frequency (HF) coupling to the VCO 404. The HF coupling operates on the supply voltage (Vdd) and a reference voltage. Thus, the input signal (the supply voltage) is AC coupled and provided to the VCO 404. As a result, an output of the VCO 404 is typically only sensitive to high frequency noise components.

The VCO 404 can be configured with a selected voltage to frequency linearity for a selected noise range or noise range of interest.

The VMON 400 can also be calibrated for a selected noise range. In one example of calibration, a supply voltage or other signal is connected directly to an input of the VCO 404. A frequency of a VCO output signal/clock 406 along with sampled ADC values from the ADC 108 are collected using a test pattern/code that generates a known Vdd signal, such as an example Vdd signal with noise. Specific ADC values (at $f_{ADC}*N$ sampling rate) and VCO frequency at those instances of time are then analyzed to generate a look up table (LUT) of frequency versus voltage (Vdd in mV).

The Vdd (or signal) is then coupled to the VCO input through a DC blocking capacitor 410. A fixed (noise free) voltage reference (Vref) is used to bias the VCO input at a suitable voltage, typically close to the supply voltage or supply voltage DC value. The application code is then run using the time delay (Tdelay) technique described above and the VCO output frequency is also measured/captured. The LUT generated during calibration is used to interpolate voltage values between ADC read values.

Figure 5:
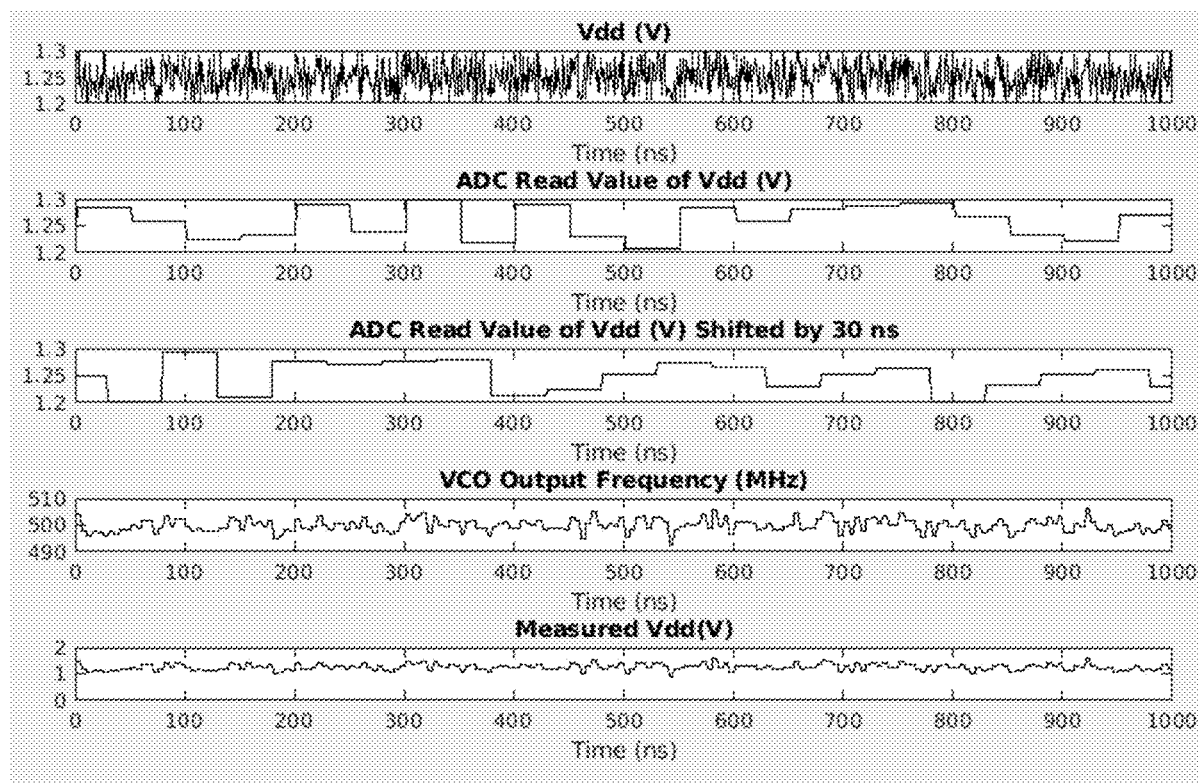
FIG. 5 is a graph illustrating an example capture of values showing noise superimposition in accordance with one or more embodiments.

FIG. 5 is a graph illustrating an example capture of values 500 showing noise superimposition in accordance with one or more embodiments. The values 500 are provided as an example for illustrative purposes.

The values 500 can be generated using the system 100, described above and suitable variations thereof.

The values 500 illustrate how the VMON 110 can be used in a noise superimposition method or technique to obtain a measured supply voltage.

The graph depicts an x-axis showing time in nanoseconds (ns) and magnitude along a y-axis.

A first plot shows values of Vdd in volts over time.

A second plot, shown below the first plot, depicts measured or read values of Vdd by the ADC 108. The ADC measurements can be generated by sweeping the Tdelay value, as described above.

A third plot, shown below the second plot, depicts ADC read values shifted by an amount, which is 30 ns in this example.

A fourth plot, shown below the third plot, depicts a VCO output frequency associated with the VMON 110. The VCO output is a frequency based on the supply voltage (Vdd).

A fifth plot, shown below the fourth plot, depicts measured Vdd over time. A lookup table indexed by frequency can be referenced to obtain voltages from the lookup table. These voltages can then be interpolated with the ADC read values of the third plot to generate the measured VDD shown in the fifth plot.

Figure 6:
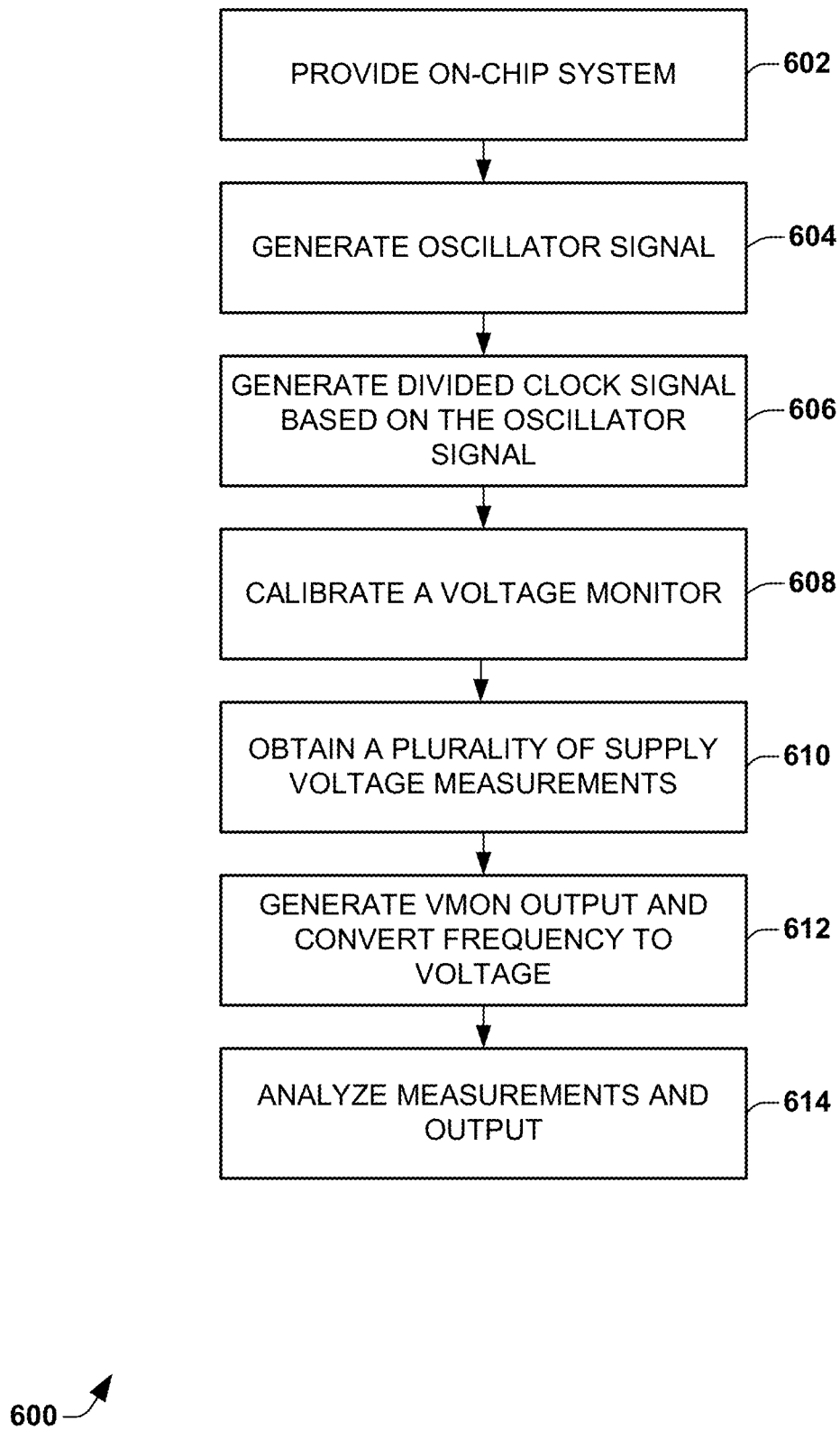
FIG. 6 is a flow diagram illustrating a method of increasing an effective sampling rate for measuring a supply voltage in accordance with one or more embodiments.

FIG. 6 is a flow diagram illustrating a method 600 of increasing an effective sampling rate for measuring a supply voltage in accordance with one or more embodiments.

The method 600 can be implemented using the system 100, described above, and variations thereof.

The method 600 begins at block 602, where an on-chip system having increased resolution and increased bandwidth of supply voltage and signal noise measurements is provided.

A phase locked loop (PLL) of the on-chip system generates an oscillator signal ($CLK_{TIM}$) at block 604. The oscillator signal can also be referred to as a local oscillator (LO) signal.

A divider generates a divided clock signal ($CLK_{ADC}$) by dividing the oscillator signal by a factor of N at block 606, where N is an integer.

A voltage monitor (VMON) is calibrated for a selected frequency and/or noise range at block 608. In one example, a lookup table (LUT) is generated using the supply voltage and a noise free voltage reference (Vref).

An ADC obtains a plurality of supply voltage (Vdd) measurements using or sweeping a plurality of time delay (TDelay) values using counter values at block 610.

The Tdelay is a time period from a start of an SoC and a start of the ADC. Counter values are used in a timer to generate the start signals/triggers (Start ADC and Application Start).

If there are N $CLK_{TIM}$ cycles for every $CLK_{ADC}$ cycle, then the ADC values read for count value difference Tdelay correspond to those values read using delay of Tdelay MOD N Sweeping through various Tdelay values generates multiple ADC read/measured values for the same point in Vdd noise. Thus, these duplicate values could be averaged for final output (after eliminating outliers). This technique of sweeping through the possible Tdelay values can effectively increase the sampling rate of the Vdd noise by N times.

The sweep generates a plurality of sweep values (from 1 to N for Tdelay) for each point or sample point. (See, FIGS. 2 and 3). The plurality of values can be averaged or otherwise combined to generate an ADC sample based on the sweep values.

A VMON or VCO output is also measured at block 612. The VMON or VCO output frequency is associated with the supply voltage measurements from block 610. A lookup table of voltages indexed by frequency can be used to convert the measured output frequency to a voltage or VMON measured voltage. The VMON measured voltage(s) can be interpolated with the ADC generated measurements to provide an enhanced sampling rate sample of the supply voltage.

The supply voltage measurements and the VMON output measurements are analyzed for noise and the like at block 614.

It is appreciated that variations of the method 600 are contemplated, such as including functionality and features of the above described arrangements and systems.

While the method(s) are illustrated and described as a series of acts or events, it is appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature may have been disclosed with respect to only one of several implementations, such feature may be combined with one or more other features of the other implementations as may be desired and advantageous for any given or particular application.

It is appreciated that the claimed subject matter may be implemented as a method, apparatus, or article of manufacture using standard programming and/or engineering techniques to produce software, firmware, hardware, or any combination thereof to control a computer to implement the disclosed subject matter (e.g., the systems, arrangements and the like shown in FIGS. 1, 2, etc., are non-limiting examples that may be used to implement the above methods). The term "article of manufacture" as used herein is intended to encompass a computer program accessible from any computer-readable device, carrier, or media. Of course, those skilled in the art will recognize many modifications may be made to this configuration without departing from the scope or spirit of the claimed subject matter.

It is to be understood that aspects described herein can be implemented by hardware, software, firmware, or any combination thereof. When implemented in software, functions can be stored on or transmitted over as one or more instructions or code on a computer-readable medium. Computer-readable media includes both computer storage media and communication media including any medium that facilitates transfer of a computer program from one place to another. A storage media or a computer readable storage device can be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or other tangible and/or non-transitory medium, that can be used to carry or store desired information or executable instructions. Also, any connection is properly termed a computer-readable medium. For example, if software is transmitted from a website, server, or other remote source using a coaxial cable, fiber optic cable, twisted pair, digital subscriber line (DSL), or wireless technologies such as infrared, radio, and microwave, then coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

Various illustrative logics, logical blocks, modules, and circuits described in connection with aspects disclosed herein can be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform functions described herein. A general-purpose processor can be a microprocessor, but, in the alternative, processor can be any conventional processor, controller, microcontroller, or state machine. A processor can also be implemented as a combination of computing devices, for example, a combination of a DSP and a microprocessor, a plurality of microprocessors, one or more microprocessors in conjunction with a DSP core, or any other such configuration. Additionally, at least one processor can comprise one or more modules operable to perform one or more of the s and/or actions described herein.

For a software implementation, techniques described herein can be implemented with modules (e.g., procedures, functions, and so on) that perform functions described herein. Software codes can be stored in memory units and executed by processors. Memory unit can be implemented within processor or external to processor, in which case memory unit can be communicatively coupled to processor through various means as is known in the art. Further, at least one processor can include one or more modules operable to perform functions described herein.

Further, the actions of a method or algorithm described in connection with aspects disclosed herein can be embodied directly in hardware, in a software module executed by a processor, or a combination thereof. A software module can reside in RAM memory, flash memory, ROM memory, EPROM memory, EEPROM memory, registers, a hard disk, a removable disk, a CD-ROM, or any other form of storage medium known in the art. An exemplary storage medium can be coupled to processor, such that processor can read information from, and write information to, storage medium. In the alternative, storage medium can be integral to processor. Further, in some aspects, processor and storage medium can reside in an ASIC. Additionally, ASIC can reside in a user terminal. In the alternative, processor and storage medium can reside as discrete components in a user terminal. Additionally, in some aspects, the s and/or actions of a method or algorithm can reside as one or any combination or set of codes and/or instructions on a machine-readable medium and/or computer readable medium, which can be incorporated into a computer program product.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form.

In addition, the articles "a" and "an" as used in this application and the appended claims should generally be construed to mean "one or more" unless specified otherwise or clear from context to be directed to a singular form.

A voltage monitor apparatus for measuring a power supply voltage is disclosed. The apparatus comprises an analog to digital converter (ADC). The ADC is configured to sample the power supply voltage by sweeping a time delay value from a first number to a selected second number to obtain a plurality of samples of the power supply voltage for a single sample point in time and to generate a sample with an enhanced sampling rate for the single sample point in time using the plurality of samples.

Another voltage monitor apparatus for measuring a power supply voltage is disclosed. The apparatus includes an analog to digital converter (ADC), a voltage controlled oscillator (VCO) and circuitry. The ADC is configured to generate supply voltage samples of the power supply voltage with an enhanced sampling rate based on a plurality of sweep samples. The VCO is configured to generate a VCO frequency output based on the power supply voltage. The circuitry is configured to determine VCO measured samples based on the VCO frequency output and combine the determined VCO measured samples with the ADC generated supply voltage samples.

A method of measuring a supply voltage is disclosed. The method includes generating an oscillator signal and a divided clock based on the oscillator signal; calibrating a voltage controlled oscillator (VCO) for a selected frequency range and noise range; obtaining a plurality of supply voltage measurements of the supply voltage by an analog to digital converter (ADC) by sweeping through a plurality of time delay values, wherein the time delay values indicate a delay between a start of application code and a start of the ADC; and generating a plurality of frequency measurements by the VCO based on the supply voltage.

A voltage monitor apparatus for measuring a power supply voltage on a chip is disclosed. The apparatus includes an ADC, a voltage controlled oscillator (VCO) and circuitry. The ADC is configured to generate supply voltage samples of the power supply voltage with an enhanced sampling rate based on a plurality of sweep samples. The VCO is configured to generate a VCO frequency output based on the power supply voltage. The circuitry is configured to determine VCO measured samples based on the VCO frequency output and combine the determined VCO measured samples with the ADC generated supply voltage samples.

An arrangement is disclosed for an on-chip system having an increased resolution for supply voltage measurements. The system includes a phase locked loop (PLL), a divider, and a timer. The PLL is configured to generate an oscillator signal. The divider is configured to divide the oscillator signal to generate an divided clock signal. The timer is configured to generate an application start signal and an analog to digital converter (ADC) start signal based on the oscillator signal and a timer delay (Tdelay). The timer delay (Tdelay) is based on the application start signal and the ADC start signal.

In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A voltage monitor apparatus for measuring a power supply voltage on a chip, the apparatus comprising:
   an analog to digital converter (ADC) configured to sample the power supply voltage by sweeping a time delay value from a first number to a selected second number to obtain a plurality of samples of the power supply voltage for a single sample point in time and to generate a sample with an enhanced sampling rate for the single sample point in time using the plurality of samples;
   a voltage controlled oscillator (VCO), wherein the VCO has a VCO frequency output proportional to the power supply voltage; and circuitry configured to interpolate an additional sample for the single sample point using the VCO frequency output and a lookup table of frequency versus voltage for the VCO.

2. The apparatus of claim 1, wherein the sample generated by the ADC is an average of the plurality of samples.

3. The apparatus of claim 1, wherein the selected second number is a number of clock cycles of a timer for each clock cycle of the ADC.

4. The apparatus of claim 1, further comprising a timer configured to generate the time delay value and an associated application start signal.

5. The apparatus of claim 4, further comprising a system on the chip (SoC) configured to run application code based on the associated application start signal, wherein the SoC introduces noise to the power supply voltage.

6. The apparatus of claim 1, wherein a signal input to the VCO is based on a reference voltage and the power supply voltage.

7. The apparatus of claim 1, wherein the circuitry is configured to generate the lookup table based at least partially on the sample generated by the ADC with the enhanced sampling rate.

8. The apparatus of claim 1, further comprising a phase locked loop (PLL) and a divider, wherein the PLL is configured to generate a timer clock signal for a timer and the divider is configured to generate an ADC clock signal for the ADC based on the timer clock signal.

9. A voltage monitor apparatus for measuring a power supply voltage on a chip, the apparatus comprising:
   an analog to digital converter (ADC) configured to generate supply voltage samples of the power supply voltage with an enhanced sampling rate based on a plurality of sweep samples;
   a voltage controlled oscillator (VCO) configured to generate a VCO frequency output based on the power supply voltage; and
   circuitry configured to determine VCO voltages based on the VCO frequency output and combine the determined VCO voltages with the ADC generated supply voltage samples.

10. The apparatus of claim 9, wherein the ADC is configured to generate the plurality of sweep samples for each clock cycle of an ADC clock used by the ADC.

11. The apparatus of claim 9, further comprising an application specific integrated circuit (ASIC).

12. The apparatus of claim 11, wherein the apparatus further includes a power supply configured to generate the power supply voltage and the apparatus is an on-chip system located on a single chip.

13. The apparatus of claim 9, wherein the VCO is calibrated for a selected noise range.

* * * * *